(12) United States Patent
Chang et al.

(10) Patent No.: US 11,682,456 B2
(45) Date of Patent: Jun. 20, 2023

(54) METHODS FOR ENLARGING THE MEMORY WINDOW AND IMPROVING DATA RETENTION IN RESTISTIVE MEMORY DEVICE

(71) Applicant: Taiwan Semiconductor Manufacturing Company Limited, Hsinchu (TW)

(72) Inventors: Fu-Chen Chang, New Taipei (TW); Chu-Jie Huang, Tainan (TW); Nai-Chao Su, Tainan (TW); Kuo-Chi Tu, Hsinchu (TW); Wen-Ting Chu, Kaohsiung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 80 days.

(21) Appl. No.: 17/460,177

(22) Filed: Aug. 28, 2021

(65) Prior Publication Data
US 2023/0062850 A1 Mar. 2, 2023

(51) Int. Cl.
  *G11C 11/00* (2006.01)
  *G11C 13/00* (2006.01)
  *H01L 45/00* (2006.01)
(52) U.S. Cl.
  CPC ...... *G11C 13/0069* (2013.01); *G11C 13/0004* (2013.01); *G11C 13/0038* (2013.01); *H01L 45/06* (2013.01); *H01L 45/146* (2013.01)

(58) Field of Classification Search
  CPC ............ G11C 13/0069; G11C 13/0004; G11C 13/0038
  USPC .......................................................... 365/148
  See application file for complete search history.

(56) References Cited

U.S. PATENT DOCUMENTS

| | | | |
|---|---|---|---|
| 9,001,553 B1* | 4/2015 | Kamalanathan ... | G11C 13/0069 365/158 |
| 2014/0192585 A1* | 7/2014 | Hashim .............. | G11C 13/0064 257/4 |

* cited by examiner

*Primary Examiner* — Vu A Le
(74) *Attorney, Agent, or Firm* — The Marbury Law Group, PLLC

(57) ABSTRACT

Methods for programming memory cells of a resistive memory device include applying a voltage pulse sequence to a memory cell to set a logic state of the memory cell. An initial set sequence of voltage pulses may be applied to the memory cell, followed by a reform voltage pulse having an amplitude greater than the amplitudes of the initial set sequence, and within ±5% of the amplitude of a voltage pulse used in an initial forming process. Additional voltage pulses having amplitudes that are less than the amplitude of the reform voltage pulse may be subsequently applied. By applying a reform voltage pulse in the middle of, or at the end of, a memory set sequence including multiple voltage pulses, a resistive memory device may have a larger memory window and improved data retention relative to resistive memory devices programmed using conventional programming methods.

20 Claims, 13 Drawing Sheets

METHODS FOR ENLARGING THE MEMORY WINDOW AND IMPROVING DATA RETENTION IN RESISTIVE MEMORY DEVICE

BACKGROUND

Resistive memory devices employ a memory element that can provide at least two resistive states providing different levels of electrical resistance. An example of an emerging resistive memory device technology is resistive random-access memory (RRAM or ReRAM). A ReRAM device is a non-volatile memory device that operates by changing the resistance across a solid-state dielectric material. Other emerging non-volatile memory technologies that utilize similar resistive switching principles include phase-change memory (PCM), magnetoresistive random-access memory (MRAM), conductive-bridging RAM (CBRAM) and carbon nanotube (CNT) memory. These emerging technologies are often considered as potential replacements for flash memory. However, to date these technologies have not been widely adopted. There is a continuing need for improvements in resistive memory technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
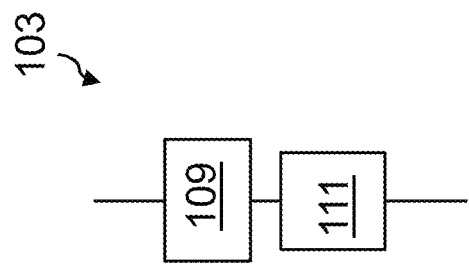
FIG. 1B schematically illustrates a memory cell of a resistive memory device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, methods of the present disclosure may be used to program a resistive memory device in order to increase a memory window and improve data retention of the resistive memory device. In various embodiments, the methods of the present disclosure may be used to program a resistive random-access memory device (also known as an "RRAM" or "ReRAM" device). However, the various methods of the present disclosure may also be applicable for programming other types of resistive memory devices, such as phase-change memory (e.g., PCRAM) devices. Other suitable types of resistive memory devices are within the contemplated scope of disclosure.

As used herein, a "resistive memory device" includes a memory device in which data may be stored by changing the electrical resistance of a memory element. The change in electrical resistance of the memory element may be incurred rapidly (e.g., in less than 10 minutes, such as less than 1 minute, including less than 1 second), may be non-volatile (i.e., the memory element will retain its resistance state in the absence of applied power for a prolonged time period, such as greater than 24 hours), and may be reversible. A resistive memory device typically includes a large number of independently functioning memory cells (such as more than $10^3$, more than $10^5$, more than $10^6$, or more than $10^9$ memory cells) organized into a memory array, where each memory cell of the memory array may include a memory element that can provide at least two resistive states providing different levels of electrical resistance.

The resistive states of the individual memory elements of a resistive memory device may be modified by applying electrical stress to the memory elements, such as via voltage or current pulsing. In the case of ReRAM memory devices, for example, the memory elements may have an initial first state of electrical resistance. In embodiments, the memory elements may include a dielectric material, and their initial state of electrical resistance may be a relatively highly resistive state. An initial, one-time "forming" step (also known as an "electroforming" step) may be performed by applying a first voltage pulse at a sufficiently high voltage to induce a soft breakdown in the material of the memory elements. In one non-limiting example, the "forming" step may include applying a single voltage pulse to the memory element, where the voltage pulse may have a voltage amplitude of more than 2.5 volts, such as 3 volts, and a pulse duration (i.e., pulse width) of more than 70 μs, such as 100 μs. The initial forming step may result in the formation of conduction paths (e.g., "filaments") through the memory elements. Following this "forming" step, the electrical resistance of the memory elements may be significantly decreased, such that they are in a stable Low Resistance State (LRS).

To reverse this process, a "Reset" process may be performed by applying one or more additional voltage pulses, which may have opposite polarity from the voltage pulse used during the "forming" step, that causes the electrical resistance of the memory elements to increase, such that they are in a stable High Resistance State (HRS). The "Reset" process may break the conduction paths, or "filaments," through the memory elements, causing the memory elements to again become relatively highly resistive. The resistivity of the memory elements after a "Reset" may be close to their original resistive state prior to the "forming" step. A "Set" process may be performed by applying one or more additional voltage pulses, which may have the same polarity as the voltage pulse used during the initial "forming" step, to cause the conduction paths to re-form, and convert the memory elements back to the Low Resistance State (LRS).

Thus, individual memory cells of the memory array may be programmed by changing the memory elements of the cell from a High Resistance State (HRS) to a Low Resistance State (LRS), or vice versa. During a read operation, a low voltage may be applied to the memory elements, and the logic state of each memory cell may be determined based on the current flow through the memory cell. A relatively higher current flow indicates that the memory element in the cell has a Low Resistance State (LRS), while a relatively lower current flow indicates that the memory element has a High Resistance State (HRS). The difference in the detected current between memory elements having a High Resistance State (HRS) and a Low Resistance State (LRS) may be referred to as the "memory window" of the resistive memory device.

One issue with current resistive memory devices is that if the "memory window" of the device is too small (i.e., the currents detected for memory elements programmed to be in the Low Resistance State (LRS) is sufficiently close to the currents detected for memory elements programmed to be in the High Resistance State (HRS)), the logic states of the memory cells may not be correctly interpreted during a read operation. This may result in the loss or corruption of data stored by the memory device.

A further issue with current resistive memory devices is that a number of memory cells programmed to be in the Low Resistance State (LRS) have been observed to exhibit a significant increase in their resistivities during data retention bake tests. In some cases, the memory cells may switch from a Low Resistance State (LRS) to a High Resistance State (HRS). These test results indicate that further improvements in data retention characteristics may be needed in order to improve the long-term reliability and performance of resistive memory devices.

In order to address the issues of excessively small memory windows and poor data retention characteristics in resistive memory devices, such as a resistive random-access memory (ReRAM) device, the various embodiments disclosed herein include methods for programming memory cells of a resistive memory device that include applying a voltage pulse sequence to a memory cell to set a logic state of the memory cell. In one embodiment, a method of programming a memory cell of a resistive memory device includes applying an initial set sequence of one or more voltage pulses to the memory cell, and applying a reform voltage pulse to the memory cell after applying the initial set sequence. The reform pulse has a voltage amplitude that is greater than a voltage amplitude of each of the voltage pulses of the initial set sequence, and is within ±5% of a voltage amplitude of a voltage pulse applied to the memory cell in an initial forming process. In various embodiments, the application of the voltage pulse sequence to the memory cell may set a logic state of the memory cell by switching the memory cell from a High Resistance State (HRS) to a Low Resistance State (LRS). In various embodiments, the voltage pulse sequence may be applied to a selected group of memory cells of the memory device to set the logic states of the selected group of memory cells.

In various embodiments, the reform voltage pulse may be similar to a voltage pulse (i.e., a "forming" voltage pulse) that is applied during the initial forming process. Applying the reform voltage pulse to the memory cell may cause conduction paths (e.g., "filaments") in the memory cell that were previously created during the initial forming process to become re-established, thereby converting the memory cell to a Low Resistance State (LRS). The reform voltage pulse may have the same polarity as the "forming" pulse. The reform voltage pulse may also have a pulse duration that is within ±5% of a pulse duration of the "forming" pulse. The one or more voltage pulses of the initial set sequence may each have a voltage amplitude that is less than the voltage amplitude of the reform pulse, and may also have a voltage amplitude that is less than 95% of the voltage amplitude of the "forming" pulse. In embodiments, the initial set sequence may include multiple voltage pulses, where each voltage pulse of the initial set sequence may have a voltage amplitude that is equal to or greater than the voltage amplitude of the preceding pulse(s) of the initial set sequence. Thus, the voltage amplitude applied to the memory cell may gradually increase over the initial set sequence of voltage pulses and the subsequent second (i.e., "reform") voltage pulse.

In various embodiments, one or more additional voltage pulses may be applied to the memory cell following the application of the reform voltage pulse. The one or more additional voltage pulses may have a voltage amplitude that is less than the voltage amplitude of the reform voltage pulse, and may also have a voltage amplitude that is less than 95% of the voltage amplitude of the "forming" pulse. The one or more additional voltage pulses may include a plurality of voltage pulses having different pulse durations and/or voltage amplitudes. The one or more additional voltage pulses may be configured to adjust a current profile of a memory array containing the memory cell.

In general, according to various embodiments the reform voltage pulse may be applied in the middle of, or at the end of, the voltage pulse sequence used to set the logic state of the memory cell. In various embodiments, the reform voltage pulse may not be applied at the beginning of the voltage pulse sequence used to set the logic state of the memory cell. A resistive memory device programmed according to methods of the present disclosure may provide for a larger memory window as well as improved data retention characteristics relative to resistive memory devices programmed using a conventional programming method.

Figure 1A:
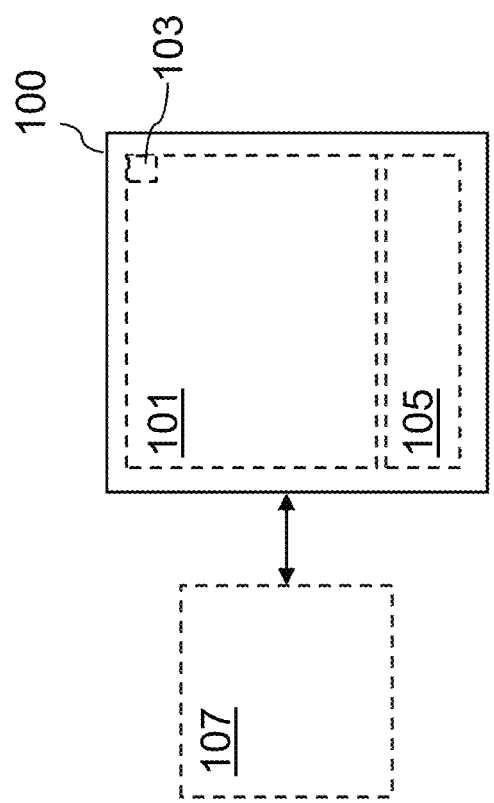
FIG. 1A schematically illustrates an exemplary structure of a resistive memory device including an array of memory cells according to one embodiment of the present disclosure.

FIG. 1A schematically illustrates an exemplary structure of a resistive memory device 100 including an array 101 of memory cells 103 according to one embodiment of the present disclosure. FIG. 1B schematically illustrates an exemplary structure of a memory cell 103 of a resistive memory device 100, such as the resistive memory device 100 shown in FIG. 1A, according to an embodiment of the present disclosure. Referring to FIG. 1A, a resistive memory device 100 may include at least one array 101 of independently-functioning memory cells 103. Each memory cell 103 of the memory array 101 may include a memory element that can provide at least two resistive states providing different levels of electrical resistance. Although a single memory cell 103 is shown in FIG. 1A, it will be understood that an array 101 typically includes a large number of memory cells 103 arranged in a two-dimensional array of memory cells 103. The resistive memory device 100 may also include a number of logic devices, such as memory selectors, power gates and input/output elements, that may be used to control the operation of the memory device 100. At least some of the logic devices may optionally be located in a peripheral circuit region 105, as schematically illustrated in FIG. 1A.

The resistive memory device 100 may also include, or may be coupled to, a processor 107. The processor 107 may include a central processing unit and a computer readable media storing programming instructions, and may be configured to cause the resistive memory device 100 to perform various operations, such as a read operation, a write operation (e.g., perform a "set" process), and/or an erase operation (e.g., perform a "reset" process) on individual memory cells 103 and/or groups of memory cells 103 of the at least one memory array 101.

FIG. 1B schematically illustrates an exemplary structure of a memory cell 103 of a resistive memory device 100, according to an embodiment of the present disclosure. Referring to FIG. 1B, the memory cell 103 may include a bit selector 109 electrically coupled to a memory element 111. The bit selector 109 may be configured to control the flow of current through the memory cell 103 (e.g., allow current to flow through the cell 103 during a read, write or erase operation of the cell 103) as well as to prevent unwanted current flow through the memory cell 103 (e.g., when the cell 103 is not being read, written to, or erased). The bit selector 109 may include one or more transistors coupled to the memory element 111, such as one or more CMOS transistors, thin-film transistors (TFTs) and/or bipolar junction transistors (BJTs). Alternately or in addition, the bit selector 109 may include one or more diodes and/or one or more selector devices, such as a threshold switching selector. The memory element 111 may include an element that includes at least two resistive states providing different levels of electrical resistance, as described above. Examples of suitable memory elements 111 include resistive memory elements (e.g., memristors) and phase-change memory elements.

Figure 1C:
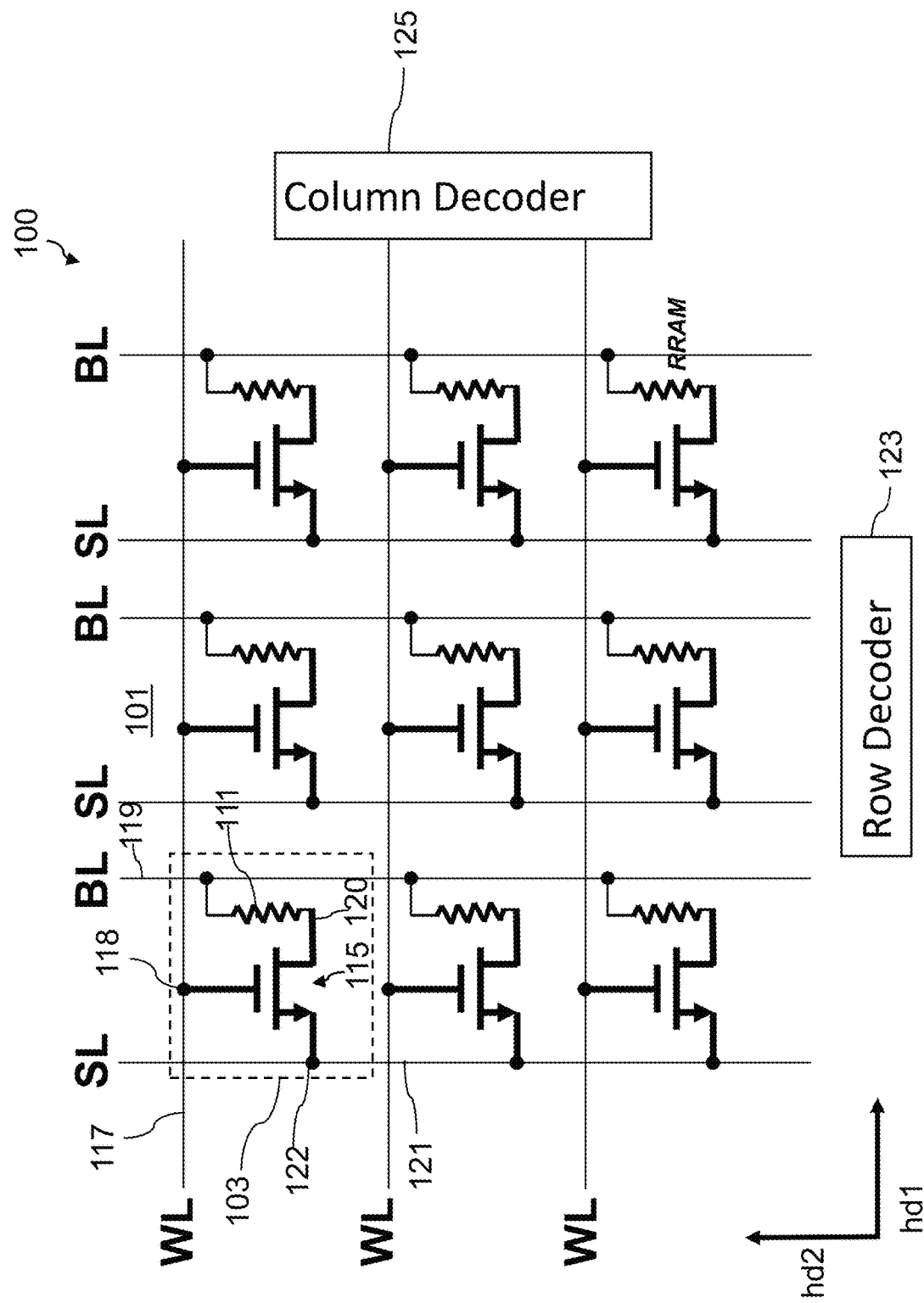
FIG. 1C is a circuit diagram that schematically illustrates an exemplary structure for an array of memory cells of a resistive memory device, such as a resistive random-access memory (ReRAM) device, according to an embodiment of the present disclosure.

FIG. 1C is a circuit diagram that schematically illustrates an exemplary structure for an array 101 of memory cells 103 of a resistive memory device 100, such as a resistive random-access memory (ReRAM) device, according to an embodiment of the present disclosure. Each memory cell 103 includes a memory element 111 that is switchable between at least two resistive states, as described above, and a bit selector, which in this embodiment comprises a transistor 115 coupled to the memory element 111. The array 101 may be arranged in a two-dimensional array of memory cells 103 each including one memory element 111 and one transistor 115. FIG. 1C shows an example of a three-bythree memory cell matrix, although it will be understood that an array 101 can include a greater or lesser number of memory cells 103.

Conductive word lines 117 may extend along a first direction of the memory array 101. Each word line 117 may electrically connect groups of memory cells 103 along the first horizontal direction hd1. Conductive bit lines 119 and source lines 121 may extend along a second horizontal direction hd2, transverse to the first direction hd1. The bit lines 119 and the source lines 121 may electrically connect groups of memory cells 103 along the second horizontal direction hd2. In the embodiment of FIG. 1C, the memory elements 111 of each memory cell 103 may be electrically connected between a respective bit line 119 and a node (e.g., a drain terminal 120) of the transistor 115 of the memory cell 103. A second node (e.g., a source terminal 122) of the transistors 115 of each memory cell 103 may be electrically connected to a respective source line 121. A third node (e.g., a gate terminal 118) of the transistors 115 of each memory cell 103 may be electrically connected to a respective word line 117. Peripheral circuitry, such as row decoder 123 and column decoder 125 may be connected to each of the word lines 117, bit lines 119 and source lines 121 of the memory array 101. The row decoder 123 and column decoder 125 may selectively control the voltages on each of the word lines 117, bit lines 119 and source lines 121.

Figure 2:
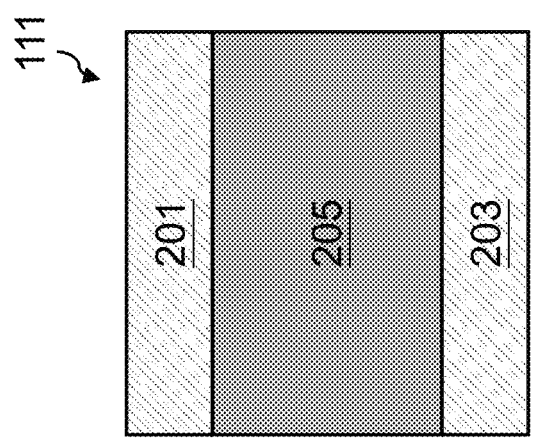
FIG. 2 is a vertical cross-sectional view illustrating a structure of a memory element of a resistive random-access memory (ReRAM) device according to an embodiment of the present disclosure.

FIG. 2 is a vertical cross-sectional view illustrating a structure of a memory element 111 of a resistive random-access memory (ReRAM) device according to an embodiment of the present disclosure. Referring to FIG. 2, a memory element 111 of a resistive random-access memory (ReRAM) device may include a switching layer 205 disposed between a first electrode 201 and a second electrode 203. The switching layer 205 may include a solid-state dielectric material that may be switchable between a High Resistance State (HRS) and a Low Resistance State (LRS). Suitable materials for the switching layer 205 may include, for example, a dielectric material, a metal oxide and/or a high-k material, such as titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), aluminum oxide ($Al_2O_3$) and silicon oxide ($SiO_2$). Other suitable materials having a resistive switching property are within the contemplated scope of disclosure. The switching layer 205 may include single layer of material or multiple layers of materials that may have the same or different compositions.

A first electrode 201 may be in electrical contact with the switching layer 205. The first electrode 201 may extend over a first (e.g., top) surface of the switching layer 205, and may also be referred to as a top electrode 201. The first electrode 201 may include one or more electrically conductive materials, which may include a metal material, a metal-nitride material and/or a doped semiconductor material, such as a doped polycrystalline semiconductor material. Suitable conductive materials may include aluminum (Al), titanium (Ti), tantalum (Ta), gold (Au), platinum (Pt), tungsten (W), nickel (Ni), iridium (Ir), titanium nitride (TiN), tantalum nitride (TaN), and aluminum nitride ($AlN_x$). Other suitable conductive materials are within the contemplated scope of disclosure. The first electrode 201 may include single layer of material or multiple layers of materials that may have the same or different compositions.

The second electrode 203 may also be in electrical contact with the switching layer 205. The second electrode 203 may extend over a second (e.g., bottom) surface of the switching layer 205, and may also be referred to as a bottom electrode 203. The second electrode 203 may include one or more electrically conductive materials, which may include a metal material, a metal-nitride material and/or a doped semiconductor material, such as a doped polycrystalline semiconductor material. Suitable conductive materials may include aluminum (Al), titanium (Ti), tantalum (Ta), gold (Au), platinum (Pt), tungsten (W), nickel (Ni), iridium (Ir), titanium nitride (TiN), tantalum nitride (TaN), and aluminum nitride ($AlN_x$). Other suitable conductive materials are within the contemplated scope of disclosure. The second electrode 203 may include single layer of material or multiple layers of materials that may have the same or different compositions. The second electrode 203 may have the same composition and structure as the first electrode 201, or may have a different composition and/or structure than the first electrode 201.

Figure 3:
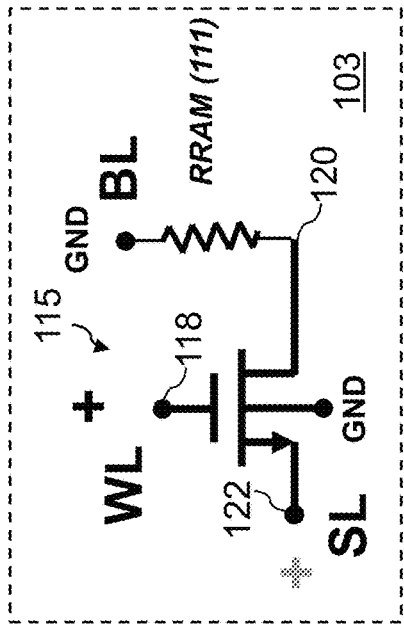
FIG. 3 is a circuit diagram schematically illustrating a forming process for a resistive memory element of a resistive memory device according to an embodiment of the present disclosure.

FIG. 3 is a circuit diagram schematically illustrating a forming process for a resistive memory element 111 of a resistive memory device, such as a ReRAM device, according to an embodiment of the present disclosure. FIG. 3 illustrates a single memory cell 103 having a resistive memory element 111 electrically connected to a transistor 115, as described above with reference to FIG. 1C. As discussed above, a resistive memory device typically includes a plurality of memory cells 103 arranged in an array. Referring to FIG. 3, a word line WL may be connected to a gate terminal 118 of the transistor 115, and a source line (SL) may be connected to a source terminal 122 of the transistor 115. A bit line (BL) may be connected to a first electrode 201 of the resistive memory element 111, and a second electrode 203 of the resistive memory element 111 may be connected to a drain terminal 120 of the transistor 115. A resistive memory device as shown in FIG. 3 in which each memory cell 103 includes a transistor 115 and a resistive memory element 111 may also be referred to as a one-transistor-one-memristor (1T1R) device.

As discussed above, a resistive memory element 111 may include a dielectric material that is normally highly electrically resistive. An initial "forming" process may be performed to induce a soft breakdown in the dielectric material of the memory element 111, and cause the formation of conduction paths, often referred to as "filaments," though the dielectric material of the resistive memory element 111. This may convert the resistive memory element 111 from a High Resistance State (HRS) to a Low Resistance State (LRS). As schematically illustrated in FIG. 3, the "forming" process may include applying a voltage pulse of a first polarity (e.g., a positive voltage pulse), having a first magnitude and a first pulse duration, to the resistive memory element 111 to create the soft breakdown condition and convert the memory element 111 to a Low Resistance State (LRS). The forming step may be applied to all memory cells of the resistive memory array to convert the cells to a Low Resistance State (LRS). The forming voltage pulse may be a "large" voltage pulse as indicated by the "++" applied to the resistive memory element 111 in FIG. 3. In one embodiment, the forming voltage pulse ($V_{forming}$) may have a voltage amplitude of more than 2.5 volts, such as 3 volts. The forming voltage pulse ($V_{forming}$) may also have a pulse duration (i.e., pulse width) of more than 70 µs, such as 100 µs. In the embodiment of FIG. 3, the forming voltage pulse ($V_{forming}$) may be applied to the bit line (BL). While the forming voltage pulse ($V_{forming}$) is applied to the bit line (BL), the word line (WL) may have a constant positive voltage, and the source line (SL) may be connected to ground (GND).

Figure 4:
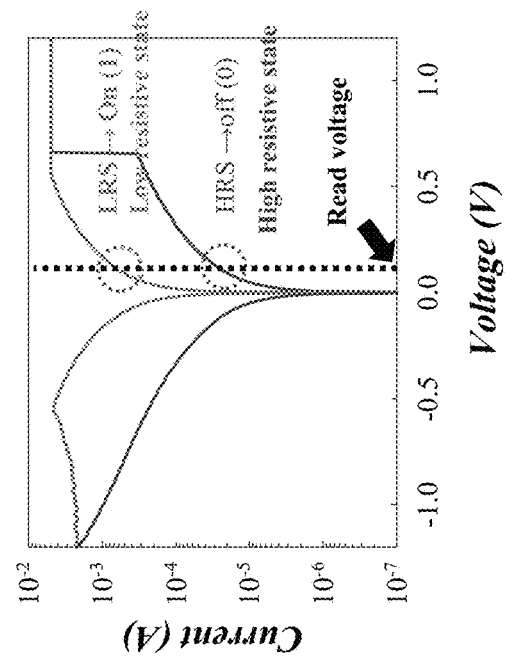
FIG. 4 is a circuit diagram schematically illustrating a reset process for a resistive memory element of a resistive memory device according to an embodiment of the present disclosure.

FIG. 4 is a circuit diagram schematically illustrating a reset process for a resistive memory element 111 of a resistive memory device, such as a ReRAM device, according to an embodiment of the present disclosure. FIG. 4 illustrates a single memory cell 103 having an identical configuration to the memory cell 103 shown in FIG. 3. Referring to FIG. 4, the reset process may include applying one or more second voltage pulses to the resistive memory element 111, where the one or more second voltage pulses applied to the resistive memory element 111 during the reset process may have an opposite polarity than the polarity of the first voltage pulse applied during the forming step. For example, when the first voltage pulse ($V_{forming}$) applied during the forming step is a positive voltage pulse, the one or more second voltage pulses applied to the resistive memory element 111 during the reset process may be one or more negative voltage pulses. In various embodiments, the reset process may include applying multiple negative voltage pulses to the resistive memory element 111, where the multiple negative voltage pulses may have different voltage amplitudes and/or pulse durations. The reset process may break the conduction paths, or "filaments," through the resistive memory element 111, causing the memory cell to switch to a High Resistance State (HRS). In one embodiment, each of the one or more "reset" voltage pulses may have a negative polarity across the resistive memory element 111, and an absolute value of each of the "reset" voltage pulses may be less than the absolute value of first voltage pulse ($V_{forming}$) applied during the forming step. For example, the one or more "reset" voltage pulses may have a voltage amplitude having an absolute value of less than 3 volts, such as less than 2.5 volts. In the embodiment of FIG. 4, the one or more "reset" voltage pulses may be applied to the source line (SL) while the word line (WL) has a constant positive voltage and the bit line (BL) is connected to ground (GND).

Figure 5:
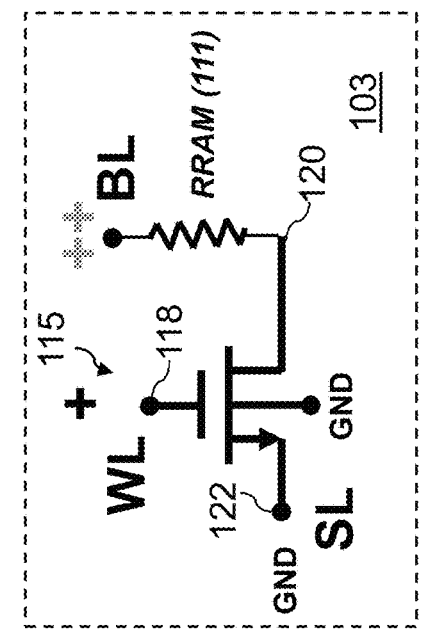
FIG. 5 is a circuit diagram schematically illustrating a set process for a resistive memory element of a resistive memory device according to an embodiment of the present disclosure.

FIG. 5 is a circuit diagram illustrating a set process for a resistive memory element 111 of a resistive memory device, such as a ReRAM device, according to an embodiment of the present disclosure. FIG. 5 illustrates a single memory cell 103 having an identical configuration to the memory cell 103 shown in FIGS. 3 and 4. Referring to FIG. 5, the set process may include applying one or more third voltage pulses to the resistive memory element 111, where the one or more third voltage pulses applied to the resistive memory element 111 during the set process may have the same polarity as the first voltage pulse applied during the forming step, and may have an opposite polarity than the one or more second voltage pulses applied to the resistive memory element 111 during the reset step. For example, both the first voltage pulse applied during the forming process and the one or more third voltage pulses applied during the set process may be positive voltage pulses, and the one or more second voltage pulses applied to the resistive memory element 111 during the reset process may be one or more negative voltage pulses. In various embodiments, the set process may include applying multiple positive voltage pulses to the resistive memory element 111, where the multiple positive voltage pulses may have different voltage amplitudes and/or pulse durations. The set process may re-establish the conduction paths, or "filaments," through the resistive memory element 111, causing the memory cell to switch to a Low Resistance State (LRS). In the embodiment of FIG. 5, the one or more "set" voltage pulses may be applied to the bit line (BL) while the word line (WL) has a constant positive voltage and the source line (SL) is connected to ground (GND).

Although FIGS. 3-5 illustrate resistor memory device having a one-transistor-one-memristor (1T1R) configuration, in which each memory cell includes a transistor 115 and a resistive memory element 111 electrically coupled to a node of the transistor 115, it will be understood that similar processes for forming, resetting and setting memory elements of a resistive memory device may be performed for memory elements having a one-diode-one-memristor (1D1R) or one-selector-one-memristor (1S1R) configuration.

In various embodiments, memory cells that are switched to a Low Resistance State (LRS) via the set process may have a first logic state (e.g., a binary logic state of "1"), and memory cells that are switched to a High Resistance State (HRS) via the reset process may have a second logic state (e.g., a binary logic state of "0"). In various embodiments, a processor including a central processing unit and a computer readable media storing programming instructions, such as processor 107 schematically illustrated in FIG. 1A, may be configured to cause the resistive memory device (e.g., a ReRAM device) to apply voltage pulses having a particular polarity, magnitude and pulse duration to selected memory cells of the resistive memory array in order to program the logic state of each of the selected memory cells of the resistive memory device.

Figure 6:
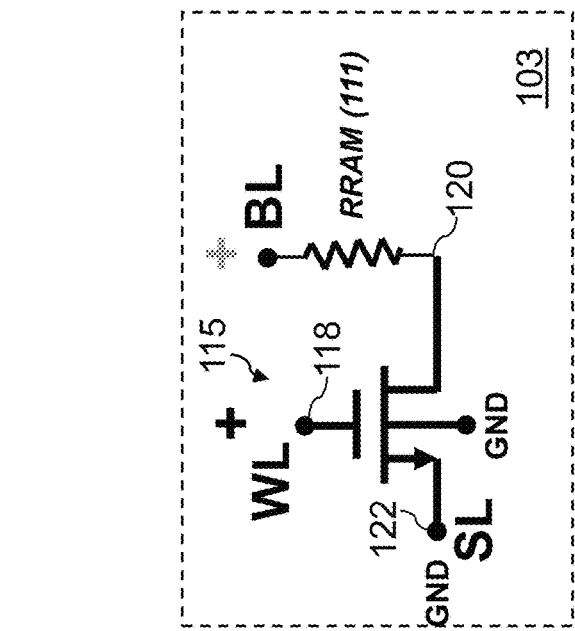
FIG. 6 is a plot showing current-voltage curves for a resistive memory device illustrating the difference in current between memory elements in a Low Resistive State (LRS) and memory elements in a High Resistive State (HRS).

FIG. 6 is a plot showing current-voltage curves for an exemplary resistive memory device illustrating the difference in current between a memory element in a Low Resistive State (LRS) and in a High Resistive State (HRS). FIG. 6 also illustrates the read voltage for the exemplary resistive memory device. Referring to FIG. 6, during a read operation, the read voltage may be applied to the resistive memory elements, and the current that flows through the resistive memory elements in a Low Resistance State (LRS) may be may be measurably higher than the current that flows through the memory element in a High Resistance State (HRS). The low resistance of the resistive memory element 111 may allow a higher current to flow, whereas a high resistance of the resistive memory element 111 may allow a lower current to flow. The "memory window" of the resistive memory device may be considered as the difference between the current that flows through the memory elements in a Low Resistance State (LRS) and the current that flows through the memory elements in a High Resistance State (HRS).

Figure 7:
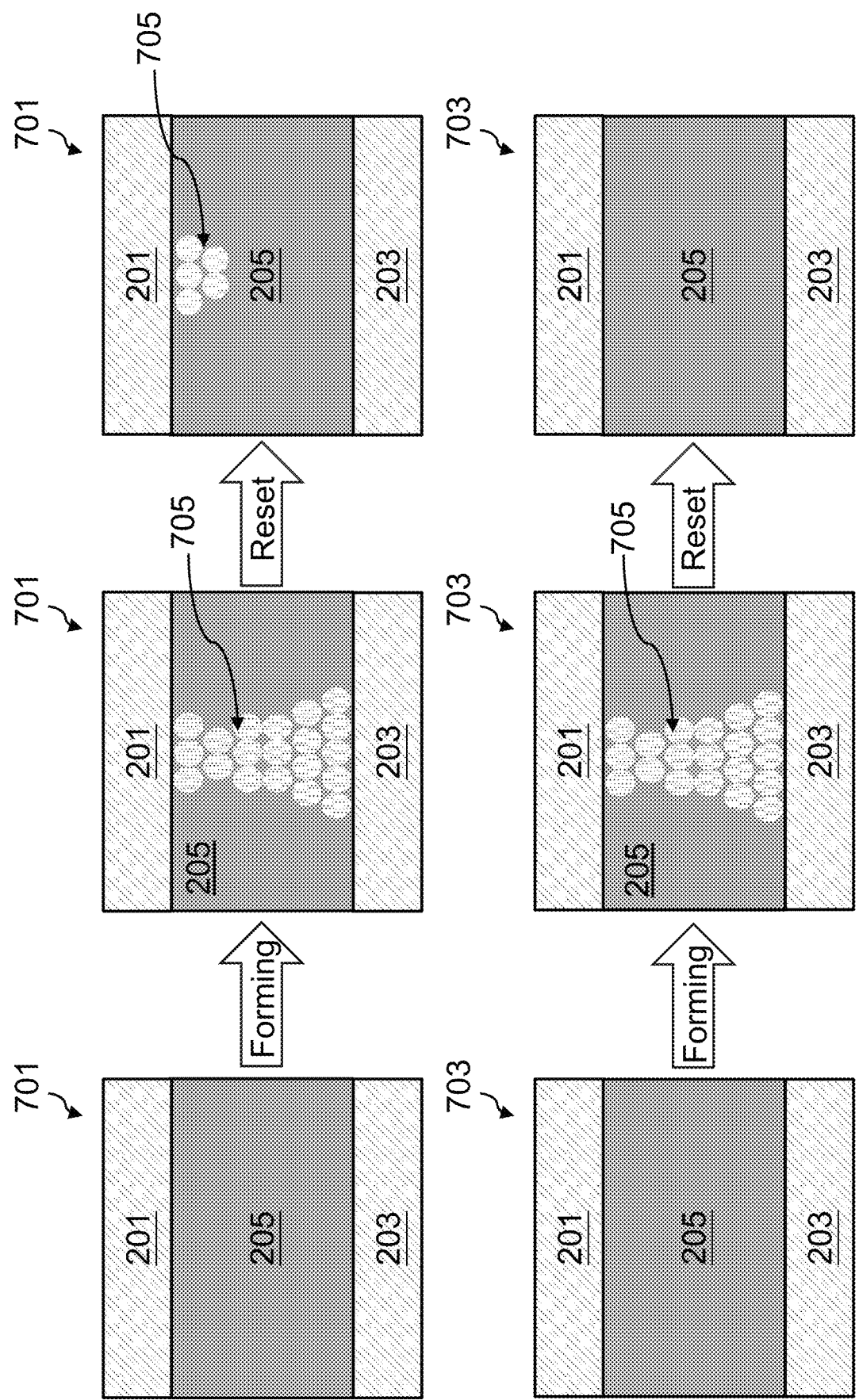
FIG. 7 shows sequential vertical cross-sectional views schematically illustrating a representative first memory element and a representative second memory element of a resistive random-access memory (ReRAM) device during a forming process and a reset process according to an embodiment of the present disclosure.

FIG. 7 shows sequential vertical cross-sectional views schematically illustrating a representative first memory element 701 and a representative second memory element 703 of a resistive random-access memory (ReRAM) device during a forming process and a reset process according to an embodiment of the present disclosure. FIG. 7 schematically illustrates the non-uniformity that may exist between resistive memory elements following the forming process and the reset process. In particular, following a forming process and a reset processes, some resistive memory elements may retain some of the conductive filaments formed during the forming process, while others may not include any of the conductive filaments, and may be fully reset back to their original highly-resistive state.

Referring to FIG. 7, the representative first memory element 701 and the representative second memory element 703 may be substantially identical to the memory element 111 shown in FIG. 2, and may each include a switching layer 205 disposed between (sometimes referred to as sandwiched between) a first electrode 201 and a second electrode 203. As schematically illustrated in the left-hand side of FIG. 7, prior to the forming process, the switching layers 205 of both the representative first memory element 701 and the representative second memory element 703 may be highly electrically resistive with no conductive filaments extending through the respective switching layers 205 in either first memory element 701, or second memory element 703. Following the forming process, conductive filaments 705 may form through the switching layers 205 of both the representative first memory element 701 and the representative second memory element 703, which may both be in a Low Resistance State (LRS).

Following a reset process, the conductive filaments 705 may not extend through the switching layers 205 of the representative first memory element 701 and the representative second memory element 703, as shown on the right-hand side of FIG. 7. Both the representative first memory element 701 and the representative second memory element 703 may be in a High Resistance State (HRS). However, at least a portion of the conductive filaments 705 may remain in the switching layer 205 of the first representative memory element 701, as shown on the top right-hand side of FIG. 7. In contrast, none of the conductive filaments 705 remain in the switching layer 205 of the second representative memory element 703, as shown on the bottom right-hand side of FIG. 7. The switching layer 205 of the second representative memory element 703 has been reset back to its original highly resistive state, as shown in the bottom right-hand side of FIG. 7.

Resistive memory elements which retain a portion of the conductive filaments following a forming process and a reset process, such as representative first memory element 701 shown in FIG. 7, may be referred to as Type 1 memory elements. Resistive memory elements which do not retain a portion of the conductive filaments following a forming process and a reset process, such as representative second memory element 703 shown in FIG. 7, may be referred to as Type 2 memory elements.

A potential issue with resistive type memory devices is that during a set process, in which at least a portion of the memory elements may be switched from a High Resistance State (HRS) to a Low Resistance State (LRS), the Type 1 memory elements, which retain a portion of conductive filaments, may more easily switch to the Low Resistance State (LRS) than the Type 2 memory elements, which do not retain a portion of the conductive filaments. Thus, following the set process, the Type 2 memory elements may have a relatively higher resistivity than the Type 1 memory elements. Further, within the Type 1 memory elements, there may be differences in the amounts of conductive filaments remaining within each of the Type 1 memory elements following the reset process, which may result in variability in the resistivities of the memory elements when they are switched to a Low Resistance State (LRS) during the set process. This variability in the resistivities of the memory elements that are switched to the Low Resistance State (LRS) during the set process may result in a large range of current flows through the memory elements that are set to the Low Resistance State (LRS) during a read operation. This may decrease the "memory window" of the memory device and may result in the logic states of some of the memory elements being misinterpreted.

As discussed above with reference to FIG. 5, the set process for a resistive memory device may include applying a series of voltage pulses having different pulse widths and voltages to selected memory elements to convert these elements to the Low Resistance State (LRS). In order to address the non-uniformity between the memory elements following the reset process—where some memory elements (i.e., Type 1 memory elements) retain some conductive filaments, while other memory elements (i.e., Type 2 memory elements) may not include any conductive filaments—the set process may include applying a voltage pulse that is similar to the voltage pulse used during the forming process. This voltage pulse may be referred to as a "Reform" voltage pulse.

Figure 8:
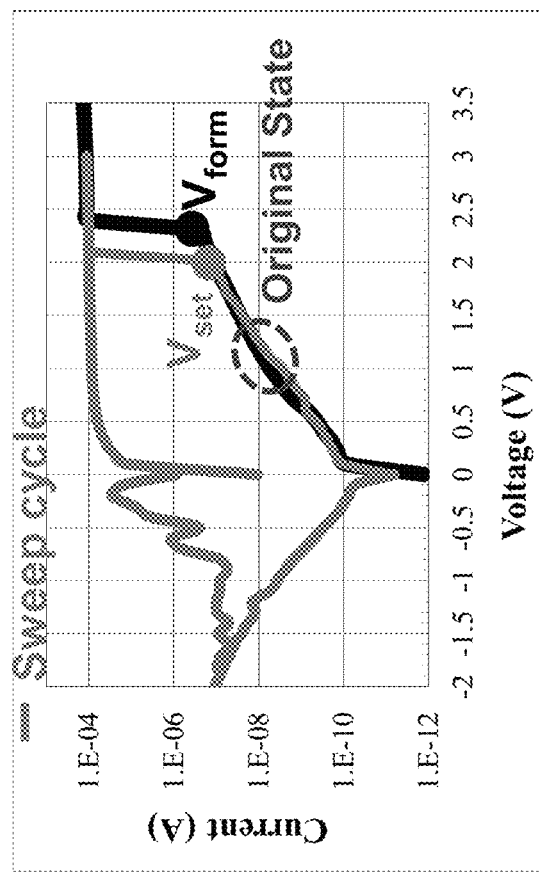
FIG. 8 is a plot showing the voltage and current profile of a fully-reset resistive memory element during a "sweep cycle" of voltages between approximately −2 volts and +3 volts superimposed over the voltage and current profile of the resistive memory element during the initial forming step.

FIG. 8 is a plot showing the voltage and current profile of a fully-reset (i.e., Type 2) resistive memory element during a "sweep cycle" of voltages between approximately −2 volts and +3 volts superimposed over the voltage and current profile of the resistive memory element during the initial forming step. Referring to FIG. 8, during the "sweep cycle," the voltage applied to the memory element is increased from 0 volts to approximately +3 volts, then decreased to approximately −2 volts, and finally increased back to 0 volts. As shown in FIG. 8, the voltage applied during the "set" process ($V_{set}$) needs to be approximately equal in magnitude to the voltage applied during the initial forming step ($V_{form}$) in order to convert the memory element to the Low Resistance State (LRS), as evidenced by mostly linear increase in current flow as voltage increases from 0 to +2 volts followed by a sudden and rapid increase in current flow from ~$10^{-7}$ A to ~$10^{-4}$ A at the "set" voltage ($V_{set}$) of approximately +2 volts. After reaching the "set" voltage ($V_{set}$), the current flow remains relatively stable at around $10^{-4}$ A during the period of the "sweep cycle" in which the voltage is increased from about +2 volts to about +3 volts, and is then decreased from about +3 volts to about +0.5 volts.

Figure 9A:
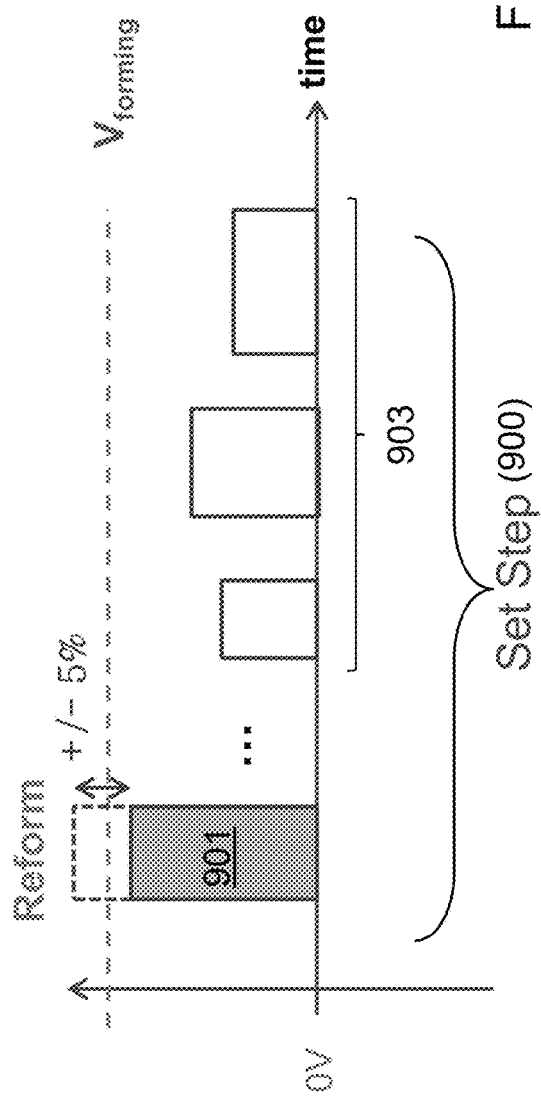
FIG. 9A is a time-series plot that schematically illustrates an exemplary voltage pulse sequence 900 of a conventional set process used to program memory cells of a resistive memory device.

FIG. 9A is a time-series plot that schematically illustrates an exemplary voltage pulse sequence 900 of a conventional set process used to program memory cells of a resistive memory device. Referring to FIG. 9A, in the conventional set process, the pulse sequence includes an initial "Reform" voltage pulse 901, followed by one or more additional voltage pulses 903. The "Reform" voltage pulse 901 has the same polarity as the voltage pulse applied during the initial forming process (i.e., the "Forming" voltage pulse), and has a voltage amplitude that is ±5% of the voltage amplitude of the Forming voltage pulse ($V_{forming}$ in FIG. 9A). In the embodiment shown in FIG. 9A, both the Forming voltage pulse and the Reform voltage pulse have a positive polarity. The one or more additional voltage pulses 903 of the voltage pulse sequence 900 may have variable pulse widths and voltage amplitudes. Generally, the one or more additional voltage pulses 903 each have a voltage amplitude that is less than the voltage amplitude of the Reform voltage pulse 901, and may have a voltage amplitude that is less than 95% of the voltage amplitude of the initial Forming voltage pulse. In embodiments, a group of memory cells, including all of the memory cells of the array, that are to be programmed to be in a Low Resistance State (LRS) may receive a voltage pulse sequence 900 as schematically illustrated in FIG. 9A.

Figure 9B:
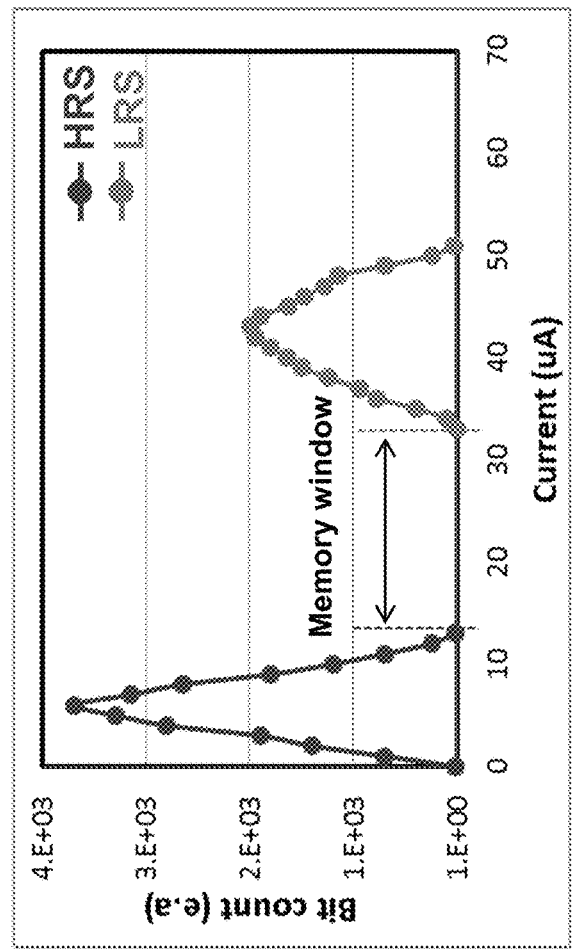
FIG. 9B is a histogram plot illustrating the distribution of current flows through memory cells of a resistive memory device, where a first group of memory cells are in a High Resistance State (HRS) and a second group of memory cells have been programmed to be in a Low Resistance State (LRS) using a conventional set process as shown in FIG. 9A.

FIG. 9B is a histogram plot illustrating the distribution of current flows through memory cells of a resistive memory device, where a first group of memory cells are in a High Resistance State (HRS) and a second group of memory cells have been programmed to be in a Low Resistance State (LRS) using a conventional set process as shown in FIG. 9A. Referring to FIG. 9B, the first group of memory cells in the High Resistance State (HRS) have currents in a range between 0 μA and ~12 pA, with a mode of ~8 μA. The second group of memory cells that are programmed to be in the Low Resistance State (LRS) have currents in a range between ~32 μA and ~50 μA, with a mode of ~42 μA. The memory window of the resistive memory device may be considered as the difference between the high end of the current range for the HRS memory cells and the low end of the current range for the LRS memory cells. In FIG. 9B, the memory window has a magnitude of approximately 20 μA.

Figure 10A:
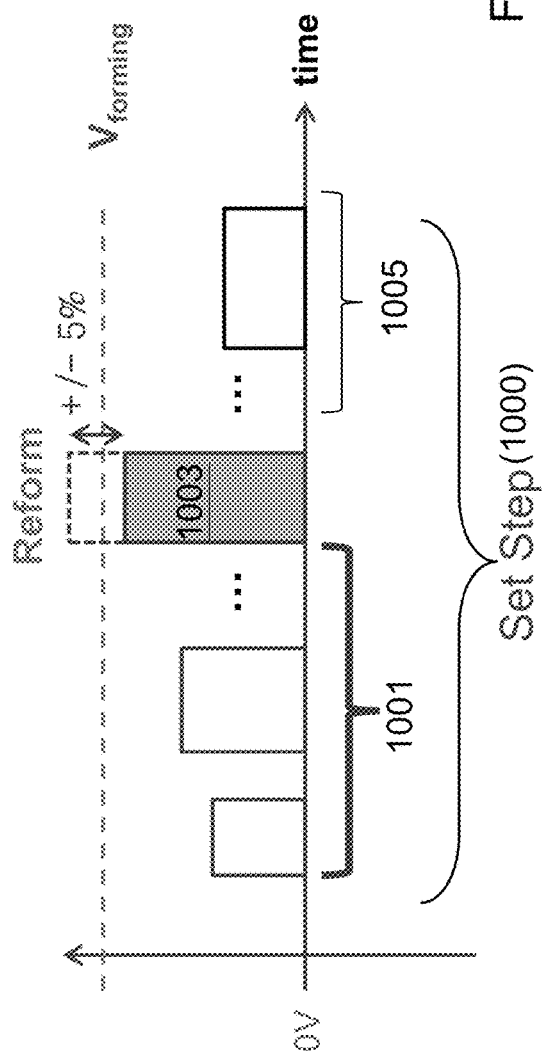
FIG. 10A is a time-series plot that schematically illustrates an exemplary voltage pulse sequence 1000 of a set process used to program memory cells of a resistive memory device according to an embodiment of the present disclosure.

FIG. 10A is a time-series plot that schematically illustrates an exemplary voltage pulse sequence 1000 of a set process used to program memory cells of a resistive memory device according to various embodiments of the present disclosure. See e.g., FIG. 5. The exemplary voltage pulse sequence 1000 may be applied to at least one memory cell 103 of the resistive memory device 100, and may be used to program the memory cell 103 to have a Low Resistance State (LRS). In various embodiments, the memory cells 103 of the resistive memory device may have a configuration such as shown in FIG. 1C, and the exemplary voltage pulse sequence 1000 may be applied to a bit line (BL) of the at least one memory cell 103 while the word line (WL) of the memory cell 103 may have a constant voltage and the source line (SL) of the memory cell 103 may be connected to ground.

In embodiments, a processor, such as processor 107 schematically illustrated in FIG. 1A, may include a central processing unit and a computer readable media storing programming instructions configured to cause the resistive memory device to apply the exemplary voltage pulse sequence to one or more selected memory cells of the resistive memory device.

Referring to FIG. 10A, the exemplary voltage pulse sequence 1000 includes an initial "set" sequence of one or more voltage pulses 1001, followed by a "reform" voltage pulse 1003. The "reform" voltage pulse 1003 may have the same polarity as the voltage pulse applied during the initial forming process (i.e., the "forming" voltage pulse), and may further have a voltage amplitude that is ±5% of the voltage amplitude of the forming voltage pulse ($V_{forming}$ in FIG. 10A). In embodiments, the "reform" voltage pulse 1003 may also have a pulse duration (i.e., pulse width) that is ±5% of the pulse duration of the forming voltage pulse. In various embodiments, the voltage amplitude of the "reform" voltage pulse 1003 may be between 2 and 5 volts, such as between 2.5 and 3.5 volts, including between 2.85 and 3.5 volts. In various embodiments, the pulse duration of the "reform" voltage pulse 1003 may be between 10 μs and 500 μs, such as between 50 μs and 150 μs, including between 95 μs and 105 μs, The one or more voltage pulses 1001 of the initial set pulse sequence may each have a voltage amplitude that is less than the voltage amplitude of the reform voltage pulse 1003, and may each have a voltage amplitude that is less than 95% of the voltage amplitude of the initial forming voltage pulse. In various embodiments, the initial "set" pulse sequence may include multiple voltage pulses, where each voltage pulse of the initial set sequence may have a voltage amplitude that is equal to or greater than the voltage amplitude of the preceding pulse(s) of the set sequence. Thus, the voltage amplitude of the voltage pulses applied to the memory cell may gradually increase throughout the initial set pulse sequence 1001 and reach a maximum voltage amplitude with the "reform" pulse 1003 that is applied following the initial set pulse sequence 1001. In embodiments, the forming voltage pulse, the initial set sequence of one or more voltage pulses 1001, and the reform voltage pulse 1003 may all have a positive polarity.

Referring again to FIG. 10A, the voltage pulse sequence 1000 of the set process may also include one or more additional voltage pulses 1005 that may be applied to the memory cell subsequent to the application of the reform voltage pulse 1003. The one or more additional voltage pulses 1005 may be configured to set a current profile of a memory array containing a plurality of memory cells. In one embodiment, the one or more additional voltage pulses 1005 may include a plurality of voltage pulses having different pulse widths and/or voltage amplitudes. In various embodiments, the one or more additional voltage pulses 1005 may each have a voltage amplitude that is less than the voltage amplitude of the reform voltage pulse 1003, and may each have a voltage amplitude that is less than 95% of the voltage amplitude of the initial forming voltage pulse.

In some embodiments, the Reform voltage pulse 1003 may be applied at the end of the "Set" process. In particular, an exemplary voltage pulse sequence 1000 may include an initial "set" sequence of one or more voltage pulses 1001 as shown in FIG. 10A, which may be optionally followed by one or more additional voltage pulses 1005 having different pulse widths and/or voltage amplitudes. The final voltage pulse of the set process may be a "reform" voltage pulse 1003 having a larger voltage amplitude than any other pulse of the voltage pulse sequence 1000.

An embodiment set process for a resistive memory device using a voltage pulse sequence 1000 as shown in FIG. 10A may be different than the conventional set process as shown in FIG. 9A in that the reform voltage pulse 1003 is not applied at the beginning of the voltage pulse sequence 1000 (as in the conventional voltage pulse sequence 900 of FIG. 9A), but rather the reform voltage pulse 1003 is applied after an initial set pulse sequence, where each of the voltage pulses 1001 of the initial set pulse sequence has a smaller voltage amplitude than the voltage amplitude of the reform voltage pulse 1003. In other words, the reform voltage pulse 1003 is not applied at the beginning of the voltage pulse sequence, but rather in the middle or end of the voltage pulse sequence of the set process.

FIGS. 10B-10E are a histogram plots illustrating the distribution of current flow through memory cells of a resistive memory device: (a) following a "reset" process (FIG. 10B) in which each of the memory cells are programmed to be in a High Resistance State (HRS), and (b) during and after an embodiment multi-pulse "set" process (FIGS. 10C-10E) in which each of the memory cells are programmed to be in a Low Resistance State (LRS).

Figure 10B:
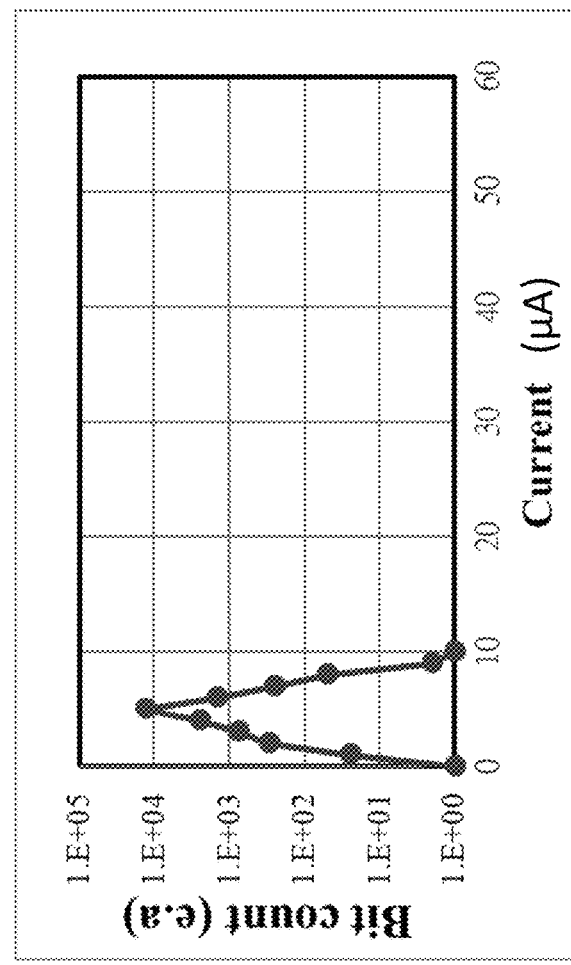
FIG. 10B is a histogram plot illustrating the distribution of current flow through memory cells of a resistive memory device following a "reset" process in which each of the memory cells are programmed to be in a High Resistance State (HRS).

FIG. 10B shows the distribution of current flows through memory cells that have been "reset" to a High Resistance State (HRS). Referring to FIG. 10B, the current flow through the memory cells in the High Resistance State (HRS) is in a range between 0 μA and ~10 μA, with a mode of ~5 μA.

Figure 10C:
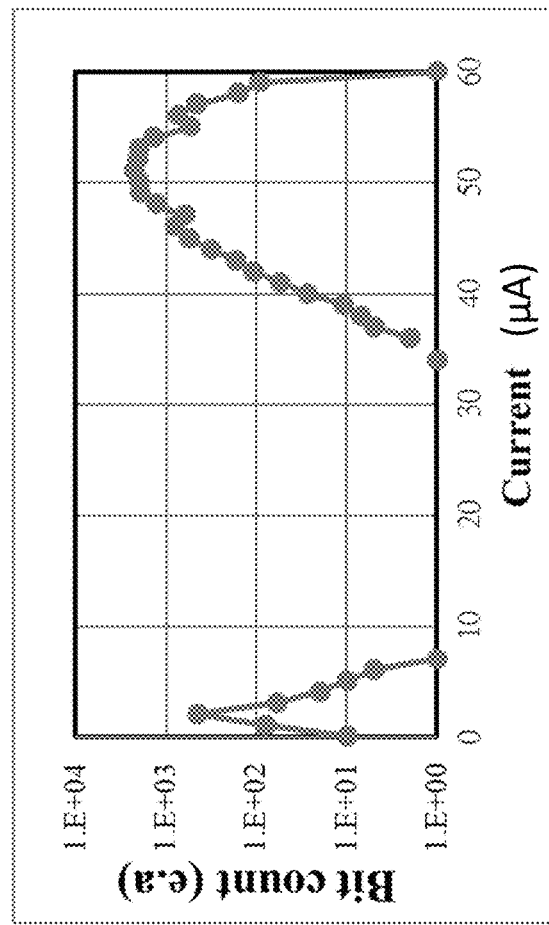
FIG. 10C is a histogram plot illustrating the distribution of current flow through the memory cells of the resistive memory device following the application of an initial "set" sequence of one or more voltage pulses to the memory in accordance with an embodiment set process as shown in FIG. 10A.

FIG. 10C shows the distribution of current flows through the memory cells following the application of an initial "set" sequence of one or more voltage pulses 1001 to the memory cells, as shown in FIG. 10A. The initial "set" sequence included a series of voltage pulses, where each voltage pulse had a voltage amplitude that was less than 95% of the voltage amplitude of the "forming" voltage pulse. Each voltage pulse of the series had a larger voltage amplitude than the prior voltage pulses of the series, so the voltage that was applied to the memory cells was gradually increased with each voltage pulse of the series. Referring to the current flow histogram of FIG. 10C, it is apparent that many of the memory cells were switched to the Low Resistance State (LRS) following the initial "set" sequence, due to large cluster of cells having current flows in a range between ~33 μA and ~60 μA. However, there remains a second cluster of cells with current flows in a range between 0 μA and ~10 μA. This indicates that the initial "set" sequence is not sufficient to convert all of the memory cells from a High Resistance State (HRS) to a Low Resistance State (LRS).

Figure 10D:
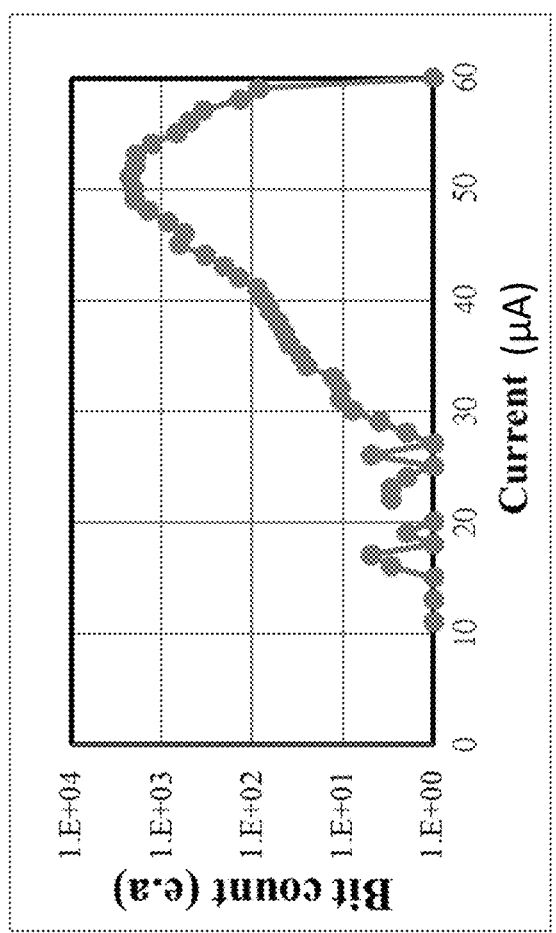
FIG. 10D is a histogram plot illustrating the distribution of current flow through the memory cells following the application of a "reform" voltage pulse to the memory cells subsequent to the application of the initial "set" sequence of one or more voltage pulses in accordance with an embodiment set process as shown in FIG. 10A.

FIG. 10D shows the distribution of current flow through the memory cells following the application of a "reform" voltage pulse 1003 to the memory cells subsequent to the application of the initial "set" sequence of one or more voltage pulses 1001, as shown in FIG. 10A. The "reform" voltage pulse 1003 included a voltage amplitude that was ±5% of the voltage amplitude of the "forming" voltage pulse, and a pulse duration that was ±5% of the pulse duration of the "forming" voltage pulse. Referring to FIG. 10D, following the "reform" voltage pulse, additional memory cells have shifted into the 30-60 µA range of current flow, and none of the memory cells remain in the 0-10 µA range of current flow. However, a small group of memory cells have current flows in a range between 10 µA to 30 µA. The memory cells in this intermediate current range may decrease the "memory window" between the Low Resistance State (LRS) and the High Resistance State (HRS).

Figure 10E:
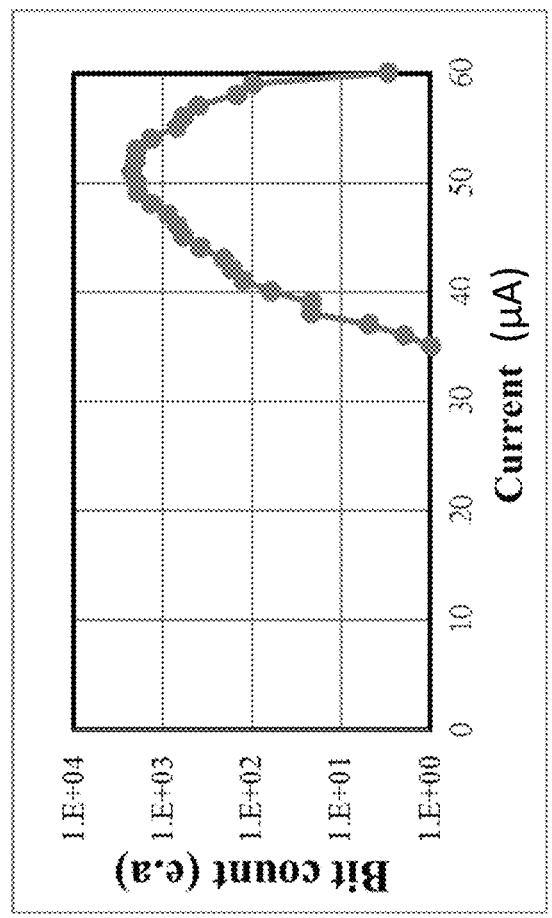
FIG. 10E is a histogram plot illustrating the distribution of current flow through the memory cells of the resistive memory device following the application of additional voltage pulses subsequent to the application of the "reform" pulse in accordance with an embodiment set process as shown in FIG. 10A.

FIG. 10E shows the distribution of current flow through memory cells following the application of additional voltage pulses 1005 subsequent to the application of the "reform" pulse 1003, as shown in FIG. 10A. The additional voltage pulses 1005 included a plurality of voltage pulses having varying voltage amplitudes and pulse durations, where none of the additional voltage pulses 1005 had a voltage amplitude that was greater than 95% of the amplitude of the "forming" voltage pulse. Referring to FIG. 10E, the additional voltage pulses 1005 shifted memory cells from the intermediate current flow range (e.g., 10 µA to 30 µA) shown in FIG. 10D into a high current flow range (e.g., 30 µA to 60 µA). In various embodiments, a purpose of applying additional voltage pulses 1005 after the "reform" voltage pulse 1003 may be to adjust the current profile of the memory cells of the array, so that all or substantially all of the memory cells programmed to be in a Low Resistance State (LRS) have current flow values that are clearly distinguishable from the current flow values of the memory cells programmed to be in a High Resistance State (HRS).

Figure 10F:
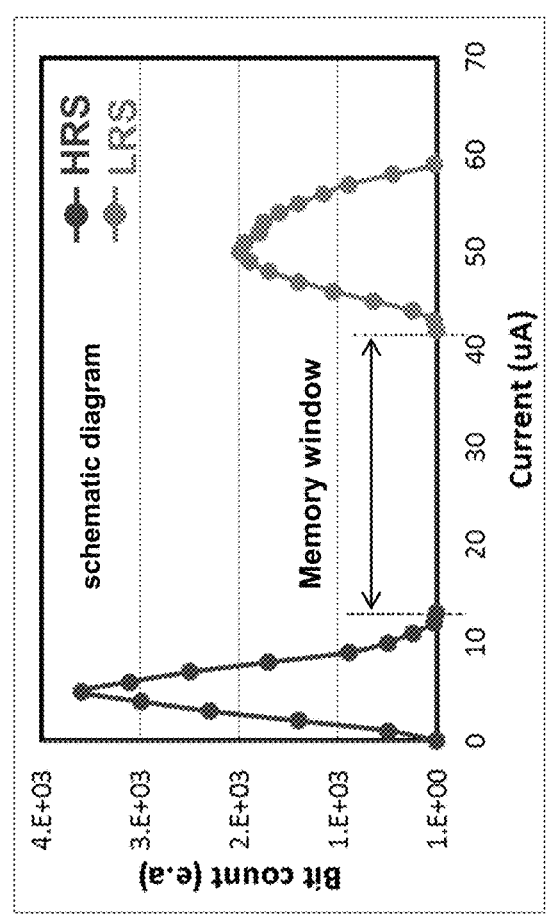
FIG. 10F is a histogram plot illustrating the distribution of current flows through memory cells of a resistive memory device, where a first group of memory cells are in a High Resistance State (HRS) and a second group of memory cells have been programmed to be in a Low Resistance State (LRS) using an embodiment set process as shown in FIG. 10A.

FIG. 10F is a histogram plot illustrating the distribution of current flows in a resistive memory device including a first group of memory cells in a High Resistance State (HRS) and a second group of memory cells that have been programmed to be in a Low Resistance State (LRS) using an embodiment "set" process as shown in FIG. 10A. Referring to FIG. 10B, the first group of memory cells in the High Resistance State (HRS) have currents in a range between 0 µA and ~12 µA, with a mode of ~8 µA. The second group of memory cells that are programmed to be in the Low Resistance State (LRS) have currents in a range between ~40 µA and ~60 µA, with a mode of ~50 µA. The memory window of the resistive memory device may be considered as the difference between the high end of the current range for the HRS memory cells and the low end of the current range for the LRS memory cells. In FIG. 10F, the memory window has a magnitude of approximately 28 µA.

Comparing the plots of FIGS. 9B and 10F, it is seen that using the embodiment set process as shown in FIG. 10A results in the Low Resistance State (LRS) memory cells having a generally higher current flow than in memory cells programmed using a conventional set process, and furthermore increases the memory window of the resistive memory device compared to a resistive memory device using a conventional set process as shown in FIG. 10A. In the example shown in FIG. 10B, programming the LRS memory cells using an embodiment set process increased the memory window by approximately 40% compared to the memory device of FIG. 10A, which was programmed using a conventional set process. By increasing the memory window, the HRS may be more distinguished from the LRS. As a result, the various data states may be more distinct from one another. In various embodiments, a resistive memory array using a programming method as shown in FIG. 10A may have a memory window of greater than 10 µA with a 0.2 volt read voltage on the bit line (BL). The tail bit (i.e., the memory cell with the lowest current flow) of the Low Resistance State (LRS) memory cells may have a current flow of 35 µA or more, such as 37 µA or more, including 40 µA or more, with a 0.2 volt read voltage on the bit line (BL).

Figure 11A:
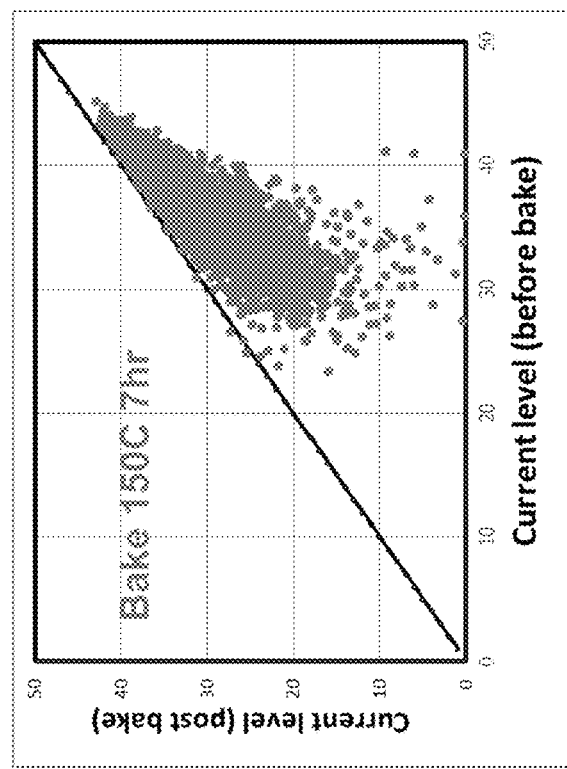
FIGS. 11A and 11B are plots showing the measured current flows through memory cells programmed to be in a Low Resistance State (LRS) using a conventional set process (FIG. 11A) and using an embodiment set process (FIG. 11B) before and after a data retention bake test.
Figure 11B:
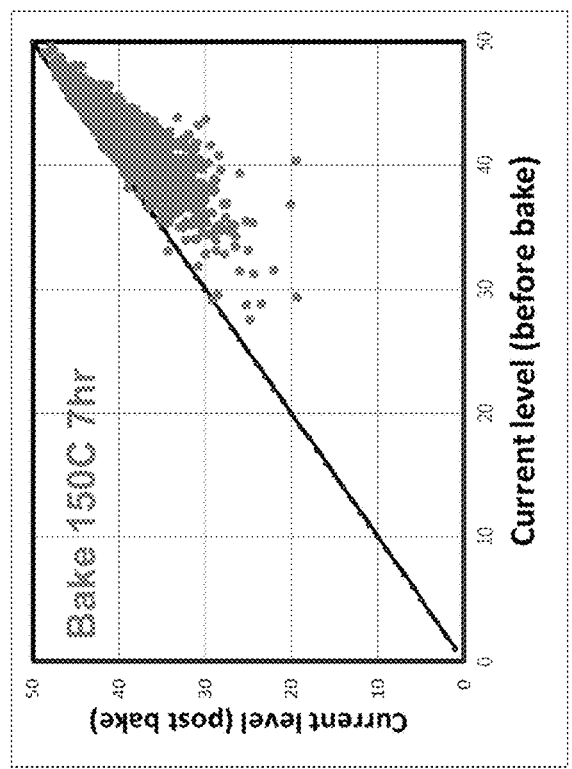

An embodiment set process as shown in FIG. 10A may also improve the data retention characteristics of a resistive memory device. FIGS. 11A and 11B are plots showing the measured current flows through memory cells programmed to be in a Low Resistance State (LRS) using a conventional set process (FIG. 11A) and using an embodiment set process (FIG. 11B) before and after a data retention bake test. A baseline current level for each memory cell was measured for a resistive memory device programmed using a conventional set process and for a resistive memory device programmed using an embodiment set process. Then, both resistive memory devices were baked at 150° C. for 7 hours to accelerate potential data retention defects, and the post-bake current levels for each of the memory cells was measured. In FIGS. 11A and 11B, the baseline current levels for the memory cells are shown along the x-axis, and the post-bake current levels for the memory cells are shown along the y-axis. In an ideal case, there would be no drop in current value in any of the memory cells, and thus no decrease in data retention performance of the device, and all of the measured current values would fit along the diagonal lines in FIGS. 11A and 11B. As is shown in FIGS. 11A and 11B, both of the memory devices exhibited some decrease in measured current values following the high-temperature bake. However, the current drop is much less pronounced in FIG. 11B, and nearly all of the measurements in FIG. 11B are clustered close to the diagonal line. In contrast, as shown in FIG. 11A, there is a significant drop in current level following the high-temperature bake among a large percentage of the memory cells programmed using a conventional set process. The data shown in FIGS. 11A and 11B indicate that programming the memory cells using an embodiment set process may improve the data retention characteristics of a memory device compared to devices programmed using a conventional set process.

A set process according to various embodiments may therefore enlarge the memory window and improve data retention characteristics of a resistive memory device, such as a ReRAM memory device. A set process according to various embodiments may not require any change to the design or structure of a resistive memory device. A set process according to various embodiments may include a change in sequence of existing programming algorithms (e.g., placing the Reform voltage pulse in the middle or at the end of a set voltage pulse sequence rather than at the beginning of the voltage pulse sequence), and may not require any increase in programming time or power consumption as compared to existing programming methods. A set process may be compatible with various types of resistive memory devices, including embedded memory.

Figure 12:
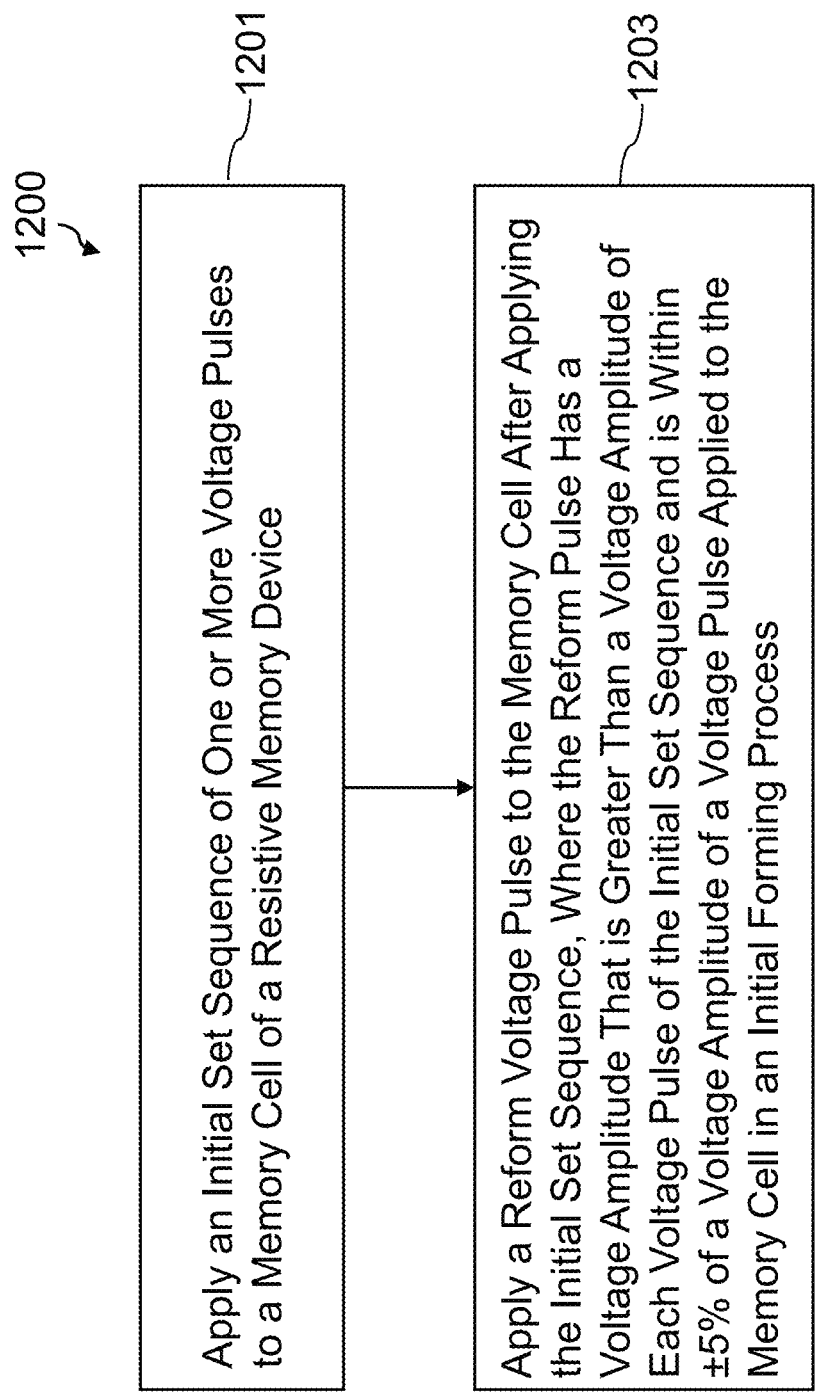
FIG. 12 is a flow chart of a method for programming a memory device in accordance with a first embodiment of the present disclosure.

FIG. 12 is a flowchart illustrating a first general method 1200 of programming a memory cell 103 of a resistive memory device 100. Referring to FIGS. 1A, 10A and 12, in step 1201, an initial set sequence of one or more voltage pulses 1001 may be applied to the memory cell 103. Referring to FIGS. 1A, 10A and 12, in step 1203, a reform voltage pulse 1003 may be applied to the memory cell 103 after applying the initial set sequence, where the reform pulse 1003 may have a voltage amplitude that is greater than a voltage amplitude of each of the voltage pulses 1001 of the initial set sequence, and is within ±5% of a voltage amplitude of a voltage pulse applied to the memory cell in an initial forming process.

Figure 13:
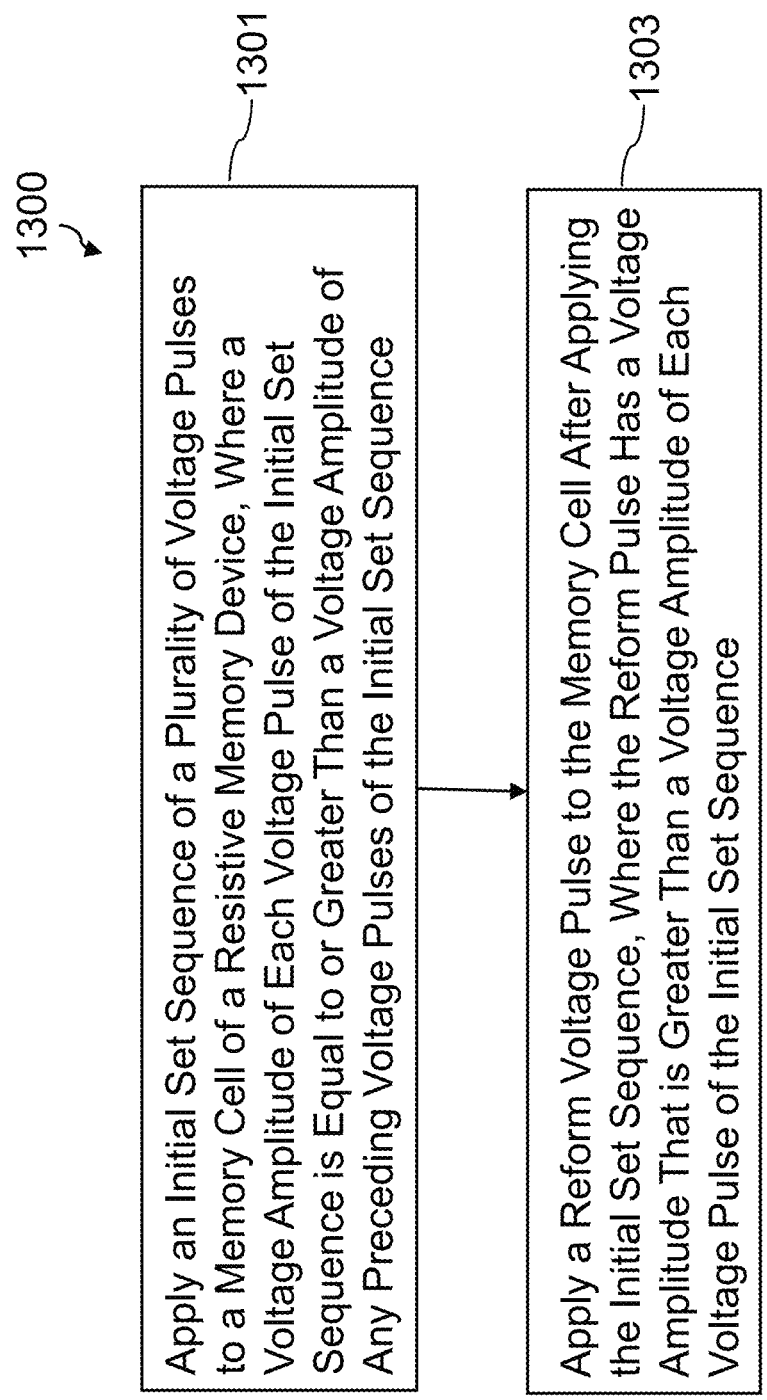
FIG. 13 is a flow chart of a method for programming a memory device in accordance with another embodiment of the present disclosure.

FIG. 13 is a flowchart illustrating a second general method 1300 of programming a memory cell 103 of a resistive memory device 100. Referring to FIGS. 1A, 10A and 12, in step 1301, an initial set sequence of one or more voltage pulses 1001 may be applied to a memory cell 103 of a resistive memory device 100, where a voltage amplitude of each voltage pulse 1001 of the initial set sequence is equal to or greater than a voltage amplitude of any preceding voltage pulses of the initial set sequence. Referring to FIGS. 1A, 10A and 12, in step 1303, a reform pulse 1003 may be applied to the memory cell 103 after applying the initial set sequence, where the reform pulse 1003 has a voltage amplitude that is greater than a voltage amplitude of each voltage pulse 1001 of the initial set sequence.

Referring to all drawings and according to various embodiments of the present disclosure, a method of programming a memory cell 103 of a resistive memory device 100 includes applying an initial set sequence of one or more voltage pulses 1001 to the memory cell 103, and applying a reform voltage pulse 1003 to the memory cell 103 after applying the initial set sequence, where the reform voltage pulse 1003 has a voltage amplitude that is greater than a voltage amplitude of each of the voltage pulses 1001 of the initial set sequence, and is within ±5% of a voltage amplitude of a voltage pulse applied to the memory cell during an initial forming process.

In one embodiment, a pulse duration of the reform voltage pulse 1003 is within ±5% of a pulse duration of a voltage pulse applied to the memory cell 103 during the initial forming process.

In one embodiment, the one or more voltage pulses 1001 of the initial set sequence, the reform voltage pulse 1003, and the voltage pulse applied to the memory cell during the initial forming process have the same polarity.

In one embodiment, the resistive memory device 100 is a resistive random-access memory (ReRAM) device.

In one embodiment, the memory cell 103 of the resistive random-access (ReRAM) memory device 100 includes a switching layer 205 disposed between a first electrode 201 and a second electrode 203.

In one embodiment, the switching layer includes at least one of titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), aluminum oxide ($Al_2O_3$) and silicon oxide ($SiO_2$), and the first electrode and the second electrode include at least one of aluminum (Al), titanium (Ti), tantalum (Ta), gold (Au), platinum (Pt), tungsten (W), nickel (Ni), iridium (Ir), titanium nitride (TiN), tantalum nitride (TaN), and aluminum nitride ($AlN_x$).

In one embodiment, the resistive memory device 100 is a phase-change memory device.

In one embodiment, the initial set sequence of one or more voltage pulses 1001 and the reform voltage pulse 1003 are applied to the memory cell 103 to set a logic state of the memory cell by switching the memory cell from a High Resistance State (HRS) to a Low Resistance State (LRS).

In one embodiment, the initial set sequence of one or more voltage pulses 1001 and the reform voltage pulse 1003 are applied to a selected group of memory cells 103 of the resistive memory device 100 to set the logic states of the selected group of memory cells 103.

In one embodiment, each of the voltage pulses 1001 of the initial set sequence has a voltage amplitude that is less than 95% of the voltage amplitude of the voltage pulse applied to the memory cell during an initial forming process.

In one embodiment, initial set sequence includes multiple voltage pulses 1001, where each voltage pulse 1001 of the initial set sequence has a voltage amplitude that is equal to or greater than the voltage amplitude of any preceding voltage pulse 1001 of the initial set sequence.

In one embodiment, the voltage pulse applied to the memory cell during an initial forming process induces a soft breakdown in a material of memory cell 103 to convert the memory cell 103 to a Low Resistance State (LRS).

In one embodiment, the method further includes applying at least one reset voltage pulse to the memory cell 103 to convert the memory cell 103 to a High Resistance State (HRS) prior to applying the initial set sequence and the reform voltage pulse 1003, wherein the at least one reset voltage pulse has an opposite polarity than a polarity of the one or more voltage pulses of the initial set sequence 1001, the reform voltage pulse 1003, and the voltage pulse applied to the memory cell 103 during an initial forming process.

In one embodiment, the method further includes applying one or more additional voltage pulses 1005 to the memory cell 103 after applying the reform voltage pulse 1003, the one or more additional voltage pulses 1005 having a voltage amplitude that is less than the voltage amplitude of the reform voltage pulse 1003, and is less than 95% of the voltage amplitude of the voltage pulse applied to the memory cell during an initial forming process.

Another embodiment is drawn to a method of programming a memory cell 103 of a resistive memory device 100 that includes applying an initial set sequence of a plurality of voltage pulses 1001 to the memory cell 103, where a voltage amplitude of each voltage pulse 1001 of the initial set sequence is equal to or greater than a voltage amplitude of any preceding voltage pulses 1001 of the initial set sequence, and applying a reform voltage pulse 1003 to the memory cell 103 after applying the initial set sequence, where the reform pulse 1003 has a voltage amplitude that is greater than a voltage amplitude of each voltage pulse 1001 of the initial set sequence.

In one embodiment, the method further includes applying one or more additional voltage pulses 1005 to the memory cell 103 after applying the reform voltage pulse 1003, the one or more additional voltage pulses 1005 having a voltage amplitude that is less than the voltage amplitude of the reform voltage pulse 1003.

Another embodiment is drawn to a resistive memory device that includes a memory array 101 having a plurality of memory cells 103, each memory cell 103 including a memory element 111 having a variable resistance that provides at least two programmable logic states, including a Low Resistance State (LRS) and a High Resistance State (HRS), and a processor 107, coupled to the memory array 101, and including a processing unit and a computer readable media storing programming instructions, wherein the processor 107 is configured to program a logic state of a selected memory cell 103 of the memory array 101 by causing the resistive memory device 100 to perform operations including applying an initial set sequence of one or more voltage pulses 1001 to the selected memory cell 103, and applying a reform voltage pulse 1003 to the selected memory cell 103 after applying the initial set sequence 1001, wherein the reform voltage pulse 1003 has a voltage amplitude that is greater than a voltage amplitude of each of the voltage pulses 1001 of the initial set sequence, and is within ±5% of a voltage amplitude of a voltage pulse applied to the selected memory cell 103 during an initial forming process.

In another embodiment, the processor 107 is configured to program a logic state of the selected memory cell 103 of the memory array 101 by causing the resistive memory device 100 to perform operations such that a pulse duration of the reform voltage pulse 1003 is within ±5% of a pulse duration of a voltage pulse applied to the selected memory cell during an initial forming process, and each of the pulses of the initial set sequence 1001 has a voltage amplitude that is less than 95% of the voltage amplitude of the voltage pulse applied to the selected memory cell during the initial forming process.

In another embodiment, the processor 107 is configured to program a logic state of the selected memory cell 103 of the memory array 101 by causing the resistive memory device 100 to perform operations such that the initial set sequence comprises multiple voltage pulses 1001, where each voltage pulse 1001 of the initial set sequence has a voltage amplitude that is equal to or greater than the voltage amplitude of any preceding voltage pulse 1001 of the initial set sequence.

In another embodiment, the processor 107 is configured to program a logic state of the selected memory cell 103 of the memory array 101 by causing the resistive memory device 100 to perform operations further including applying one or more additional voltage pulses 1005 to the selected memory cell 103 after applying the reform voltage pulse 1003, the one or more additional voltage pulses 1005 having a voltage amplitude that is less than the voltage amplitude of the reform voltage pulse 1003, and is less than 95% of the voltage amplitude of the voltage pulse applied to the memory cell during an initial forming process.

By applying a reform voltage pulse in the middle of, or at the end of, a pulse sequence including multiple voltage pulses used to set the logic state of a memory cell, a resistive memory device programmed according to methods of the present disclosure may have a larger memory window and improved data retention characteristics relative to resistive memory devices programmed using a conventional programming method.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of programming a memory cell of a resistive memory device, comprising:
    applying an initial set sequence of one or more voltage pulses to the memory cell; and
    applying a reform voltage pulse to the memory cell after applying the initial set sequence, wherein the reform voltage pulse has a voltage amplitude that is greater than a voltage amplitude of each of the one or more voltage pulses of the initial set sequence, and is within ±5% of a voltage amplitude of a voltage pulse applied to the memory cell during an initial forming process.

2. The method of claim 1, wherein a pulse duration of the reform voltage pulse is within ±5% of a pulse duration of the voltage pulse applied to the memory cell during the initial forming process.

3. The method of claim 1, wherein the one or more voltage pulses of the initial set sequence, the reform voltage pulse, and the voltage pulse applied to the memory cell during the initial forming process have the same polarity.

4. The method of claim 1, wherein the resistive memory device comprises a resistive random-access memory (ReRAM) device.

5. The method of claim 4, wherein the memory cell of the resistive random-access (ReRAM) memory device comprises a switching layer disposed between a first electrode and a second electrode.

6. The method of claim 5, wherein the switching layer comprises at least one of titanium dioxide ($TiO_2$), hafnium dioxide ($HFO_2$), hafnium-aluminum-dioxide ($HF_xAl_{1-x}O_2$), tantalum pentoxide ($Ta_2O_5$), tungsten dioxide ($WO_2$), zirconium dioxide ($ZrO_2$), aluminum oxide ($Al_2O_3$) and silicon oxide ($SiO_2$), and the first electrode and the second electrode comprise at least one of aluminum (Al), titanium (Ti), tantalum (Ta), gold (Au), platinum (Pt), tungsten (W), nickel (Ni), iridium (Ir), titanium nitride (TiN), tantalum nitride (TaN), and aluminum nitride ($AlN_x$).

7. The method of claim 1, wherein the resistive memory device comprises a phase-change memory device.

8. The method of claim 1, wherein the initial set sequence of the one or more voltage pulses and the reform voltage pulse are applied to the memory cell to set a logic state of the memory cell by switching the memory cell from a High Resistance State (HRS) to a Low Resistance State (LRS).

9. The method of claim 1, wherein the initial set sequence of the one or more voltage pulses and the reform voltage pulse are applied to a selected group of memory cells of the resistive memory device to set logic states of the selected group of memory cells.

10. The method of claim 1, wherein each of the one or more voltage pulses of the initial set sequence has a voltage amplitude that is less than 95% of the voltage amplitude of the voltage pulse applied to the memory cell during the initial forming process.

11. The method of claim 1, wherein the initial set sequence comprises multiple voltage pulses, where each voltage pulse of the initial set sequence has a voltage amplitude that is equal to or greater than the voltage amplitude of any preceding voltage pulse of the initial set sequence.

12. The method of claim 1, wherein the voltage pulse applied to the memory cell during the initial forming process induces a soft breakdown in a material of memory cell to convert the memory cell to a Low Resistance State (LRS).

13. The method of claim 1, further comprising:
    applying at least one reset voltage pulse to the memory cell to convert the memory cell to a High Resistance State (HRS) prior to applying the initial set sequence and the reform voltage pulse, wherein the at least one reset voltage pulse has an opposite polarity than a polarity of the one or more voltage pulses of the initial set sequence, the reform voltage pulse, and the voltage pulse applied to the memory cell during an initial forming process.

14. The method of claim 1, further comprising:
    applying one or more additional voltage pulses to the memory cell after applying the reform voltage pulse, the one or more additional voltage pulses having a voltage amplitude that is less than the voltage amplitude of the reform voltage pulse, and is less than 95% of the voltage amplitude of the voltage pulse applied to the memory cell during the initial forming process.

15. A method of programming a memory cell of a resistive memory device, comprising:
applying an initial set sequence of a plurality of voltage pulses to the memory cell, where a voltage amplitude of each voltage pulse of the initial set sequence is equal to or greater than a voltage amplitude of any preceding voltage pulses of the initial set sequence; and
applying a reform voltage pulse to the memory cell after applying the initial set sequence, wherein the reform pulse has a voltage amplitude that is greater than a voltage amplitude of each voltage pulse of the initial set sequence.

16. The method of claim 12, further comprising:
applying one or more additional voltage pulses to the memory cell after applying the reform voltage pulse, the one or more additional voltage pulses having a voltage amplitude that is less than the voltage amplitude of the reform voltage pulse.

17. A resistive memory device, comprising:
a memory array comprising a plurality of memory cells, each memory cell including a memory element having a variable resistance that provides at least two programmable logic states, including a Low Resistance State (LRS) and a High Resistance State (HRS); and
a processor, coupled to the memory array, and including a processing unit and a computer readable media storing programming instructions, wherein the processor is configured to program a logic state of a selected memory cell of the memory array by causing the resistive memory device to perform operations comprising:
applying an initial set sequence of one or more voltage pulses to the selected memory cell; and
applying a reform voltage pulse to the selected memory cell after applying the initial set sequence, wherein the reform voltage pulse has a voltage amplitude that is greater than a voltage amplitude of each of the one or more voltage pulses of the initial set sequence, and is within ±5% of a voltage amplitude of a voltage pulse applied to the selected memory cell during an initial forming process.

18. The resistive memory device of claim 17, wherein the processor is configured to program a logic state of the selected memory cell of the memory array by causing the resistive memory device to perform theoperations such that a pulse duration of the reform voltage pulse is within ±5% of a pulse duration of a voltage pulse applied to the selected memory cell during an initial forming process, and each of the one or more voltage pulses of the initial set sequence has a voltage amplitude that is less than 95% of the voltage amplitude of the voltage pulse applied to the selected memory cell during the initial forming process.

19. The resistive memory device of claim 17, wherein the processor is configured to program a logic state of the selected memory cell of the memory array by causing the resistive memory device to perform the operations such that the initial set sequence comprises multiple voltage pulses, where each voltage pulse of the initial set sequence has a voltage amplitude that is equal to or greater than the voltage amplitude of any preceding voltage pulse of the initial set sequence.

20. The resistive memory device of claim 17, wherein the processor is configured to program a logic state of the selected memory cell of the memory array by causing the resistive memory device to perform the operations further comprising:
applying one or more additional voltage pulses to the selected memory cell after applying the reform voltage pulse, the one or more additional voltage pulses having a voltage amplitude that is less than the voltage amplitude of the reform voltage pulse, and is less than 95% of the voltage amplitude of the voltage pulse applied to the memory cell during an initial forming process.

* * * * *